United States Patent [19]

Inagaki

[11] Patent Number: 5,256,997
[45] Date of Patent: Oct. 26, 1993

[54] LINEAR PHASED FILTER FOR REDUCING RIPPLE IN GROUP DELAY

[75] Inventor: Ryosuke Inagaki, Kyoto, Japan

[73] Assignee: Rohm Co., Ltd., Kyoto, Japan

[21] Appl. No.: 820,800

[22] Filed: Jan. 15, 1992

[30] Foreign Application Priority Data

Jan. 31, 1991 [JP] Japan .................................. 3-031510

[51] Int. Cl.⁵ .............................................. H03H 7/01
[52] U.S. Cl. ................................. 333/28 R; 333/167; 333/175
[58] Field of Search ...................... 333/28 R, 133, 168, 333/174-176, 167

[56] References Cited

U.S. PATENT DOCUMENTS

| | | | |
|---|---|---|---|
| 2,181,499 | 11/1939 | Wheeler | 333/168 |
| 3,047,823 | 7/1962 | Ranky | 333/188 |
| 3,530,408 | 9/1970 | Brandon et al. | 333/28 R |
| 3,673,521 | 6/1972 | Yuguchi | 333/28 R |
| 3,794,938 | 2/1974 | Boelter | 333/168 |
| 4,263,619 | 4/1981 | Theriault | 333/176 X |
| 4,395,688 | 7/1983 | Sellers | 333/168 X |
| 4,454,487 | 6/1984 | Darmouri | 333/28 R |

Primary Examiner—Paul Gensler
Attorney, Agent, or Firm—Fish & Richardson

[57] ABSTRACT

A first filter the group delay of which in the pass band contains a ripple is connected to a second filter so as to cancel the ripple. The second filter has a pass band at least within the pass band of the first filter. The gain of the second filter is reduced gradually from the frequency of the minimum attenuation into the lower and higher frequency regions and the group delay thereof is reduced gradually from the frequency of the minimum attenuation into the lower and higher frequency regions.

8 Claims, 8 Drawing Sheets

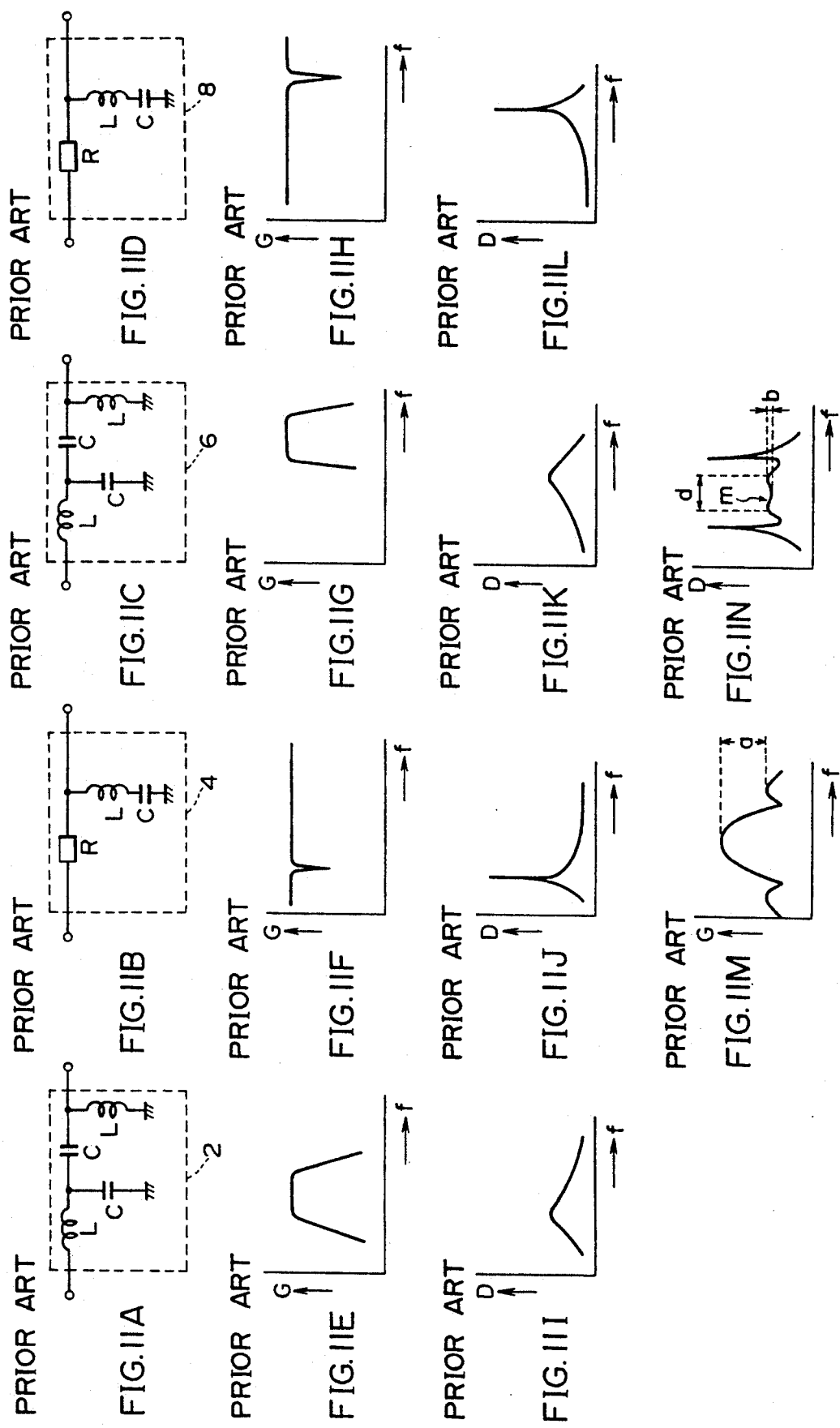

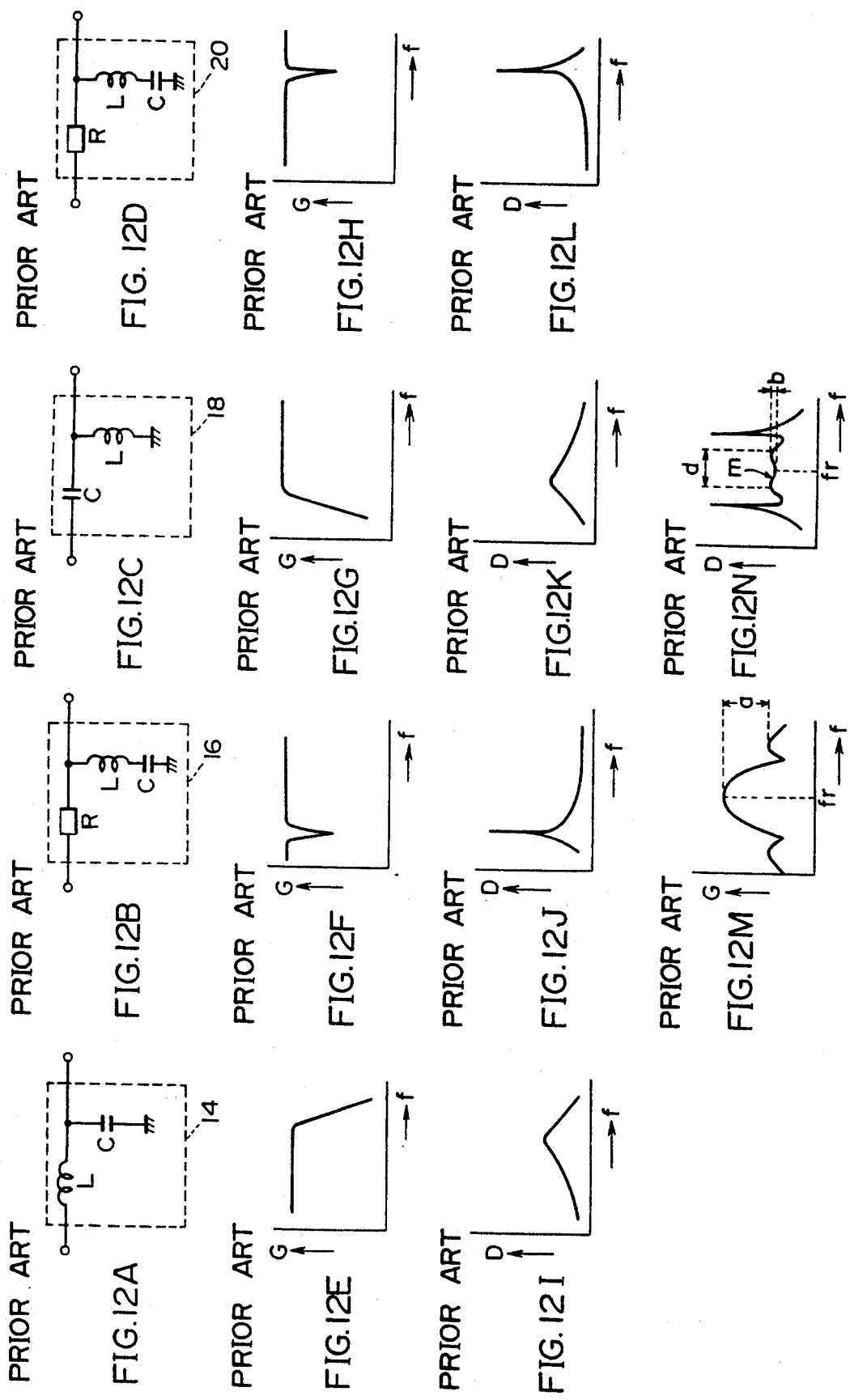

LINEAR PHASED FILTER FOR REDUCING RIPPLE IN GROUP DELAY

BACKGROUND OF THE INVENTION

1. Field of the Invention

The present invention relates to filter equipment such as a filter composed of discrete elements, a filter incorporated into a hybrid IC and a filter incorporated into a monolithic IC. More particularly, the present invention relates to a simple design method for a linear phased filter.

2. Description of the Related Art

Filter equipments are conventionally used in a wide range of electric apparatuses. A filter equipment is a device for filtering an input signal at a predetermined frequency. Some filters are composed of discrete elements, and others are incorporated into an IC such as a hybrid IC.

FIGS. 9 and 10 show examples of conventional filters. These filter equipments are designed in accordance with a technique of superimposing filters having a comparatively simple structure, namely, comparatively simple characteristics so as to synthesize a filter equipment having desired characteristics.

For example, the filter equipment shown in FIG. 9 is composed of bandpass filters (hereinunder referred to as "BPF") 2 and 6, and trap filters (hereinunder referred to as "TRAP") 4 and 8 which are connected in series in any given order. Such a filter is synthesized in accordance with the steps shown in FIGS. 11A to 11N.

The BPF 2, TRAP 4, BPF 6 and TRAP 8 have simple structures such as those shown in FIGS. 11A to 11D, respectively. Each of these filters as a constituent of the filter equipment is composed of an inductor (L), a capacitor (C) and the like. The BPF 2, TRAP 4, BPF 6 and TRAP 8 have gain responses shown in FIGS. 11E to 11H, respectively, and group delay responses shown in FIGS. 11I to 11L, respectively. In these drawings, the symbol f represents frequency, G gain and D delay.

By connecting these BPF 2, TRAP 4, BPF 6 and TRAP 8 in the form of a cascade, the gain response shown in FIG. 11M and the group delay response shown in FIG. 11N are obtained. In other words, FIGS. 11M and 11N show the gain response and the group delay response synthesized from the characteristics shown in FIGS. 11E to 11H and FIGS. 11I to 11L, respectively. If a signal is input from an input terminal 10 to the thus-synthesized filter equipment, a signal filtered in accordance with the characteristics shown in FIG. 11M and FIG. 11N is obtained from an output terminal 12.

The filter equipment shown in FIG. 10 is composed of a low-pass filter (hereinunder referred to as "LPF") 14, TRAP's 16, 20 and a high-pass filter (hereinunder referred to as "HPF") 18 which are connected in the form of a cascade. Each of the constituents LPF 14, TRAP 16, 20 and HPF 18 of this filter equipment also has a simple structure, which consists of L, C, etc.

The LPF 14, TRAP 16, HPF 20 and TRAP 18 have the structures shown in FIGS. 12A to 12D, respectively, and the gain responses and the group delay responses thereof are shown in FIGS. 12E to 12H, and 12I to 12L, respectively. Therefore, the gain response shown in FIG. 12M and the group delay response shown in FIG. 12N are realized by connecting the LPF 14, TRAP 16, HPF 20 and TRAP 18 in the form of a cascade. In this conventional filter equipment, if a signal is input from an input terminal 22 to the thus-synthesized filter equipment, a signal filtered in accordance with the characteristics shown in FIGS. 11M and 11N is obtained from an output terminal 24 in the same way as in the filter equipment shown in FIG. 9.

In this way, a conventional filter equipment having a given characteristic is realized by superimposing filters having a comparatively simple structure and a comparatively simple characteristic as the constituents thereof. According to this technique, design having a high degree of freedom is possible. For example, it is possible to realize a sharp cutoff characteristic by combining a cutoff through an LPF and a trap through a TRAP.

In the case of realizing a filter equipment in accordance with this technique, however, the generation of a ripple of the group delay is inevitable in the pass band. FIGS. 11N and 12N show that the group delay in the pass band d contains a ripple of m having a width of b. The width b of the ripple m becomes larger as the gain a is set at a larger value, as shown in FIGS. 11M and 12M.

Such inconvenience especially obstructs the realization of a linear phased filter. The linear phased filter refers to a filter having a linear phase characteristic in the pass band. Since the shape of the phase characteristic is equivalent to the shape of integrated group delay responses, a linear phased filter is not obtained unless the group delay response is flat. A linear phased filter is a filter required in, for example, acoustic apparatuses so as to faithfully reproduce the original sound.

SUMMARY OF THE INVENTION

Accordingly, it is an object of the present invention to eliminate the above-described problems in the related art and to provide a filter equipment having a flat group delay response in the pass band and a sharp cutoff characteristic by connecting several filters in the form of a cascade.

To achieve this aim, a filter equipment according to the present invention comprises:

a) a first filter having a predetermined pass band in which the group delay has a ripple; and b) a second filter which has a pass band within the pass band of the first filter, the gain of which is reduced gradually from a predetermined frequency within the pass band into the higher and lower frequency regions, the group delay of which is likewise gradually reduced from the same predetermined frequency within the pass band into the higher and lower frequency regions so as to make the ripple of the group delay of the first filter flat across a predetermined frequency band, and which is connected to the first filter in cascade.

According to this structure, the ripple of the group delay in the pass band of the first filter is compensated for by the second filter, so that the filter equipment as a whole across a predetermined frequency band has a flat group delay response. In other words, a so-called linear phased filter is realized.

In this structure, the first filter may be either a filter having a comparatively simple structure or a combination of such filters. The same applies to the second filter.

As described above, the first filter approximately determines the pass band and the gain response of the filter equipment. Therefore, the first filter may include a bandpass filter for determining the pass band of the first filter. The bandpass filter can be a combination of a low-pass filter and a high-pass filter for determining the upper cutoff frequency and the lower cutoff frequency, respectively, of the pass band. In addition, a trap filter may be used so as to intensify the cutoff shape.

The second filter may include a low-pass filter for determining the higher cutoff shape and a high-pass filer for determining the lower cutoff shape.

The above and other objects, features and advantages of the present invention will become clear from the following description of the preferred embodiments thereof, taken in conjunction with the accompanying drawings.

BRIEF DESCRIPTION OF THE DRAWINGS

FIGS. 2A to 2D are characteristic curves showing the gain responses of the filters which constitute a filter 31 of the first embodiment, wherein FIG. 2A shows the gain response of a TRAP 311,
FIG. 2B shows the gain response of a TRAP 312,
FIG. 2C shows the gain response of an HPF 313, and
FIG. 2D shows the gain response of an LPF 314;

FIGS. 2F to 2I are characteristic curves showing the group delay responses of the filters which constitute the filter 31 of the first embodiment, wherein FIG. 2F shows the group delay response of the TRAP 311,
FIG. 2G shows the group delay response of the TRAP 312,
FIG. 2H shows the group delay response of the HPF 313, and
FIG. 2I shows the group delay response of the LPF 314;

FIGS. 11A to 11D are circuit diagrams of the filters which constitute the first example of the conventional filter equipment, wherein FIG. 11A is a circuit diagram of a BPF 2,
FIG. 11B is a circuit diagram of a TRAP 4
FIG. 11C is a circuit diagram of a BPF 6, and
FIG. 11D is a circuit diagram of a TRAP 8;

FIGS. 11E to 11H show the gain responses of the filters which constitute the first example of the conventional filter equipment, wherein FIG. 11E shows the gain response of the BPF 2, FIG. 11F shows the gain response of the TRAP 4
FIG. 11G shows the gain response of the BPF 6, and
FIG. 11H shows the gain response of the TRAP 8;

FIGS. 11I to 11L show the group delay responses of the filters which constitute the first example of the conventional filter equipment, wherein FIG. 11I shows the group delay response of the BPF 2,
FIG. 11J shows the group delay response of the TRAP 4
FIG. 11K shows the group delay response of the BPF 6, and
FIG. 11L shows the group delay response of the TRAP 8;

FIG. 11M shows the gain response of the first example of the conventional filter equipment;

FIG. 11N shows the group delay response of the first example of the conventional filter equipment;

FIGS. 12A to 12D are circuit diagrams of the filters which constitute the second example of the conventional filter equipment, wherein FIG. 12A is a circuit diagram of an LPF 14,
FIG. 12B is a circuit diagram of a TRAP 16,
FIG. 12C is a circuit diagram of an HPF 18, and
FIG. 12D is a circuit diagram of a TRAP 20;

FIGS. 12E to 12H show the gain responses of the filters which constitute the second example of the conventional filter equipment, wherein FIG. 12E shows the gain response of the LPF 14,
FIG. 12F shows the gain response of the TRAP 16,
FIG. 12G shows the gain response of the HPF 18, and
FIG. 12H shows the gain response of the TRAP 20;

FIGS. 12I to 12L show the group delay responses of the filters which constitute the second example of the conventional filter equipment, wherein FIG. 12I shows the group delay response of the LPF 14,
FIG. 12J shows the group delay response of the TRAP 16,
FIG. 12K shows the group delay response of the HPF 18, and
FIG. 12L shows the group delay response of the TRAP 20;

FIG. 12M shows the gain response of the second example of the conventional filter equipment; and
FIG. 12N shows the group delay response of the second example of the conventional filter equipment.

DESCRIPTION OF THE PREFERRED EMBODIMENTS

Figure 1:
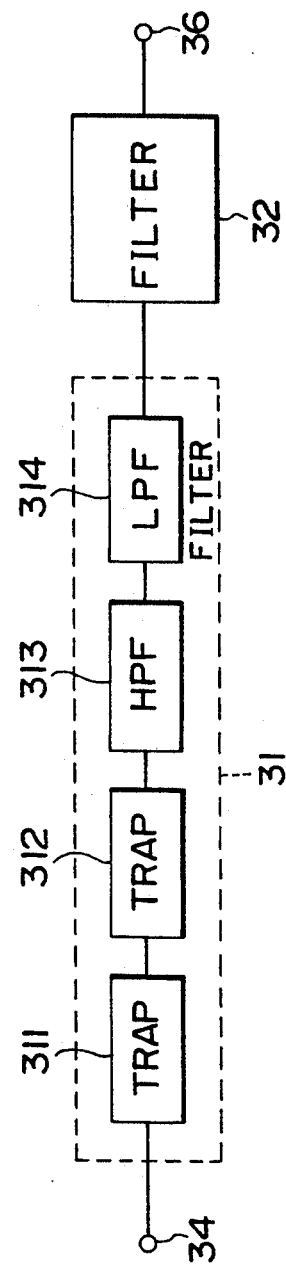
FIG. 1 is a block diagram of the structure of a first embodiment of a filter equipment of the present invention.

FIG. 1 shows the structure of a first embodiment of a filter equipment according to the present invention.

This embodiment is composed of a filter 31 which is designed in accordance with a conventional technique and a filter 32 having a structure characteristic of the present invention, both filters being connected to each other in the form of a cascade. The filter 32 has a simple structure, which consists of L, C, etc., or a composition of such filters. The reference numeral 34 denotes an input terminal and 36 an output terminal.

Figure 2A:
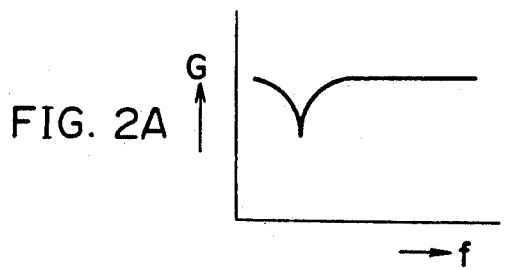
Figure 2F:
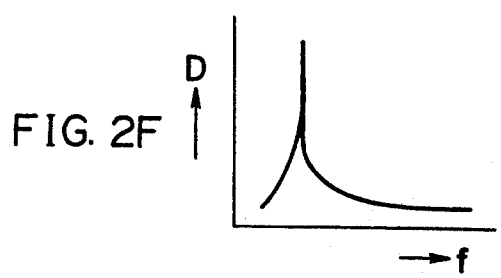
Figure 2B:
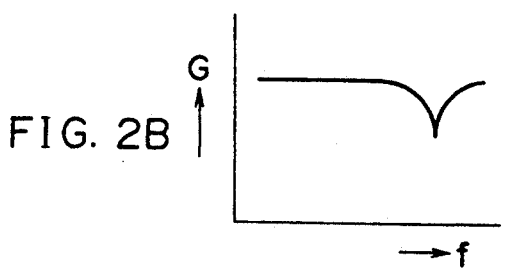
Figure 2G:
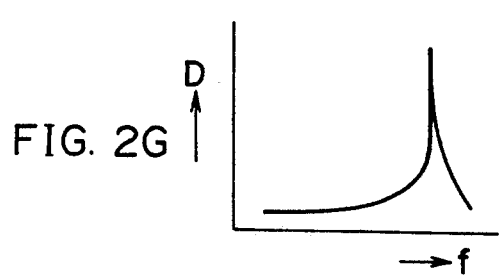
Figure 2C:
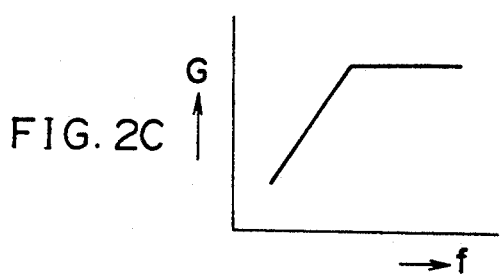
Figure 2H:
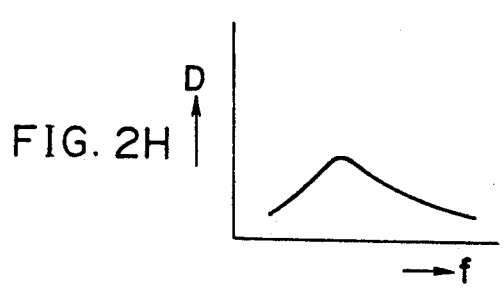
Figure 2D:
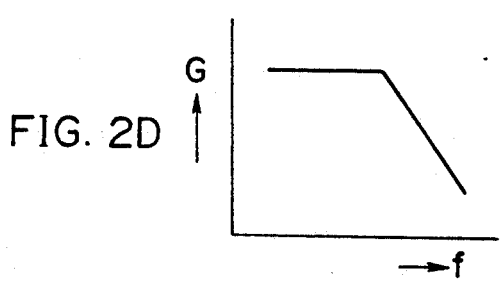
Figure 2I:
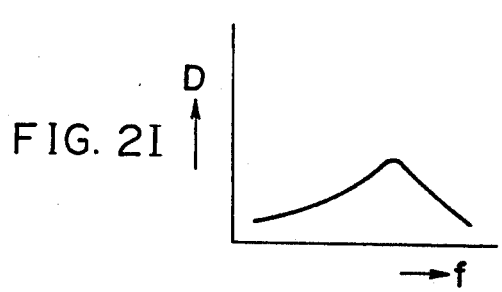
Figure 2E:
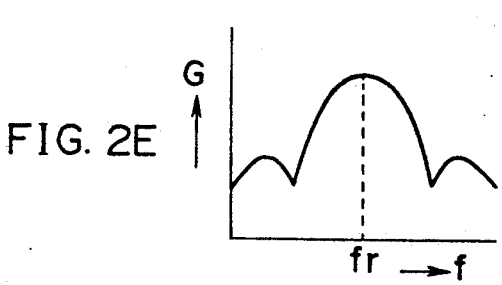
FIGS. 2E and 3A show the gain response of the filter 31 of the first embodiment.
Figure 2J:
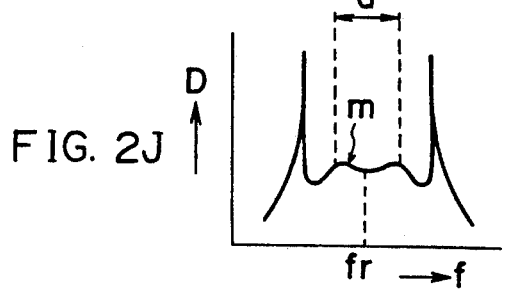
FIGS. 2J and FIG. 3D show the group delay response thereof.

The filter 31 is composed of TRAP's 311, 312, an HPF 313 and an LPF 314 which are connected in the form of a cascade. The filter 31 especially has the role of setting the pass band to a predetermined frequency band and realizing a sharp cutoff characteristic. The TRAP 311 has a gain response shown in FIG. 2A and a group delay response shown in FIG. 2F. The TRAP 312 has a gain response shown in FIG. 2B and a group delay response shown in FIG. 2G. The HPF 313 has a gain response shown in FIG. 2C and a group delay response shown in FIG. 2H. The LPF 314 has a gain response shown in FIG. 2D and a group delay response shown in FIG. 2I. Therefore, the filter 31 has an overall gain response shown in FIG. 2E and an overall group delay response shown in FIG. 2J.

Since the filter 31 is designed in accordance with a conventional technique, the group delay in the pass band d has a ripple m. This embodiment is characterized in that the ripple m is cancelled by the filter 32 so that the filter equipment as a whole produces a flat group delay in the pass band.

Figure 3A:
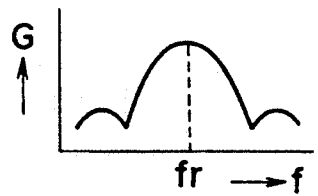
Figure 3D:
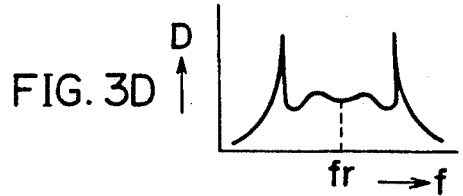
Figure 3B:
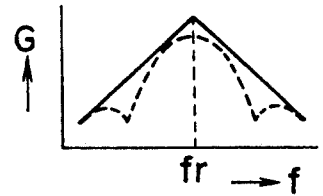
FIG. 3B shows the gain response of a filter 32 of the first embodiment.
Figure 3E:
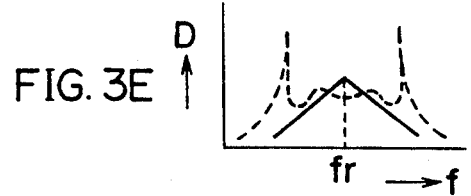
FIG. 3E shows the group delay response thereof.

The filter 32 filters the output of the filter 31 which has a gain response shown in FIG. 3A and a group delay response shown in FIG. 3D. The filter 32 has a gain response shown in FIG. 3B and a group delay response shown in FIG. 3E. In order to provide these gain response and group delay response for the filter 32, firstly, the pass band of the filter 32 is set within the pass band of the filter 31. Secondly, the gain response of the filter 32 is set so that the attenuation is at a minimum at the center frequency fr of the pass band of the filter 31. Thirdly, the gain response and the group delay response of the filter 32 are set so that the gain and the group delay reduce gradually from the frequency fr into the higher and lower frequency regions in the shape of a wedge.

Figure 3C:
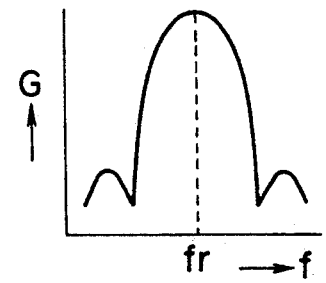
FIG. 3C shows the gain response of the first embodiment.
Figure 3F:
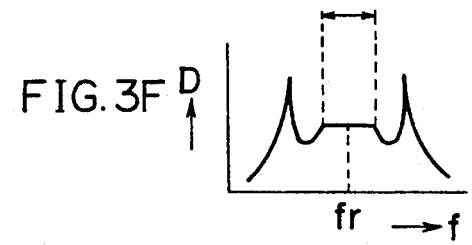
FIG. 3F shows the group delay response of the embodiment.
Figure 4:
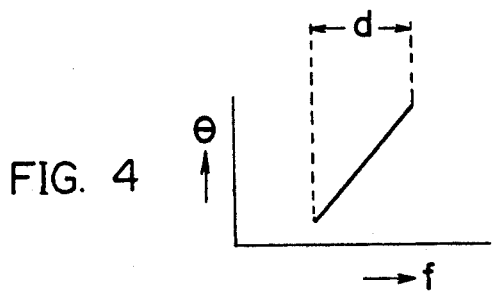
FIG. 4 shows the phase characteristic of the first embodiment in the pass band.

When the output of the filter 31 is filtered through the filter 32 having the above-described characteristics, the filters 31 and 32 in total produce the gain response and the group delay response shown in FIGS. 3C and 3F. Firstly, the gain response (FIG. 3A) of the filter 31 is intensified in the filters 31 and 32 in total. Secondly, the ripple m of the group delay of the filter 31 disappears, in other words, a flat group delay response is obtained in the pass band of the filters 31 and 32 in total. In the case of actually designing the filter equipment of this embodiment, the group delay response is first measured and the frequency band in which the delay response is to be made flat is then determined. Finally, the filter 32 which has the thus-determined frequency band as the pass band is designed.

In this way, in the filter equipment shown in FIG. 1 as a whole, the flat group delay response is obtained in the pass band. If the group delay response is rewritten by the phase characteristics, the phase $\theta$ becomes linear in the pass band d. Therefore, the filter equipment of this embodiment is a linear phased filter. According to the filter equipment of this embodiment, for example, it is possible to reproduce a necessary frequency component faithfully to the original sound. Thus, it is possible to improve the sound quality in a simple manner by adding one filter (filter 32) to a conventional equipment.

Although the pass band in which the group delay response is to be made flat is set with the center frequency fr as the center in this embodiment, the pass band may be shifted to a higher or lower frequency. The filter 32 may be disposed at the stage preceding the filter 31. The function of the filter 32 is chiefly explained in this embodiment, but the concrete structure of the filter 32 is not explained in detail. The filter 32 can be designed in accordance with a known filter designing technique. Although the filter 32 preferably has a simple structure such as those shown in FIGS. 11 and 12 from the point of view of simplification of the structure of the equipment, it goes without saying that a more complicated structure can also realize a linear phased filter.

Figure 5:
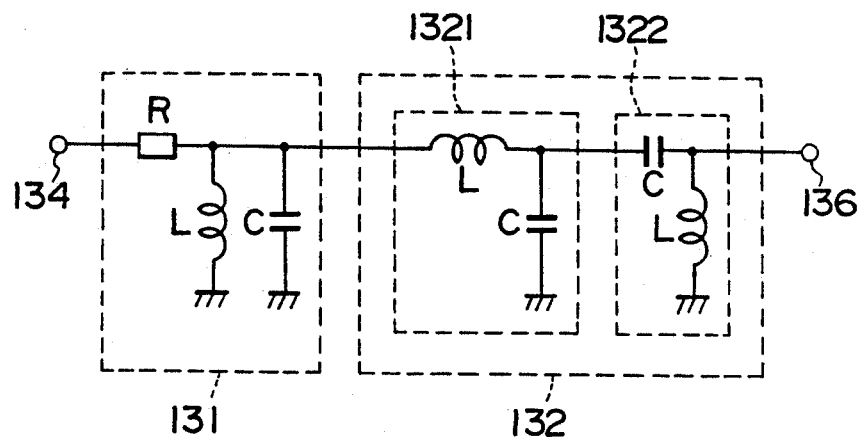
FIG. 5 is a block diagram of the structure of a second embodiment of a filter equipment of the present invention.

FIG. 5 shows the structure of a second embodiment of the present invention. This embodiment is composed of a filter 131 having a comparatively simple structure and a filter 132 having a complicated structure, both filters being connected to each other in the form of a cascade. The reference numeral 134 represents an input terminal and 136 an output terminal. The filter 131 has the function of setting the pass band and the level of the gain. The filter 132, which is composed of an LPF 1321 and an HPF 1322 connected to each other in the form of a cascade, has the function of intensifying the gain response and making the group delay flat in the pass band. The pass band of the filter 132 is determined by the cutoff frequency of the LPF 1321 and the HPF 1322.

Figure 6:
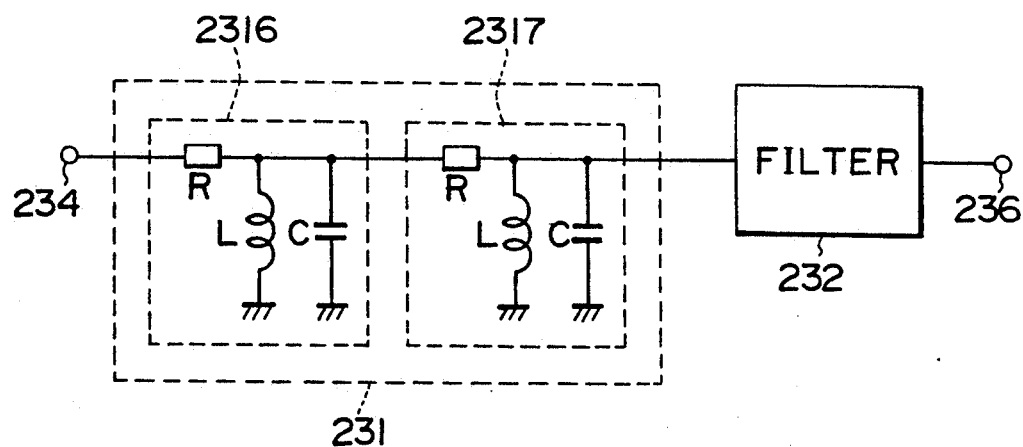
FIG. 6 is a block diagram of the structure of a third embodiment of a filter equipment of the present invention.

FIG. 6 shows the structure of a third embodiment of a filter equipment according to the present invention. This embodiment is composed of a filter 231 having a comparatively complicated structure and a filter 232 having a simple structure, both filters being connected to each other in the form of a cascade. The reference numeral 234 represents an input terminal and 236 an output terminal. The filter 231, which is composed of BPF's 2316 and 2317 connected to each other in the form of a cascade, has a function of setting the pass band and the level of the gain. The filter 232 has the function of intensifying the gain response and making the group delay flat in the pass band.

According to any of these embodiments, it is possible to realize a linear phased filter having a simple structure.

Figure 7:
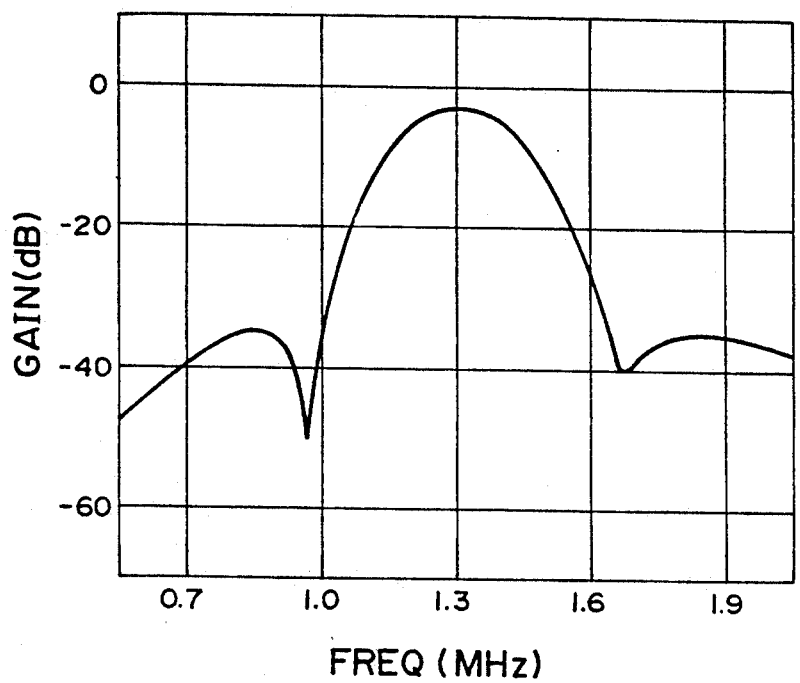
FIGS. 7 and 8 are characteristic curves showing the advantages of the present invention.
Figure 8:
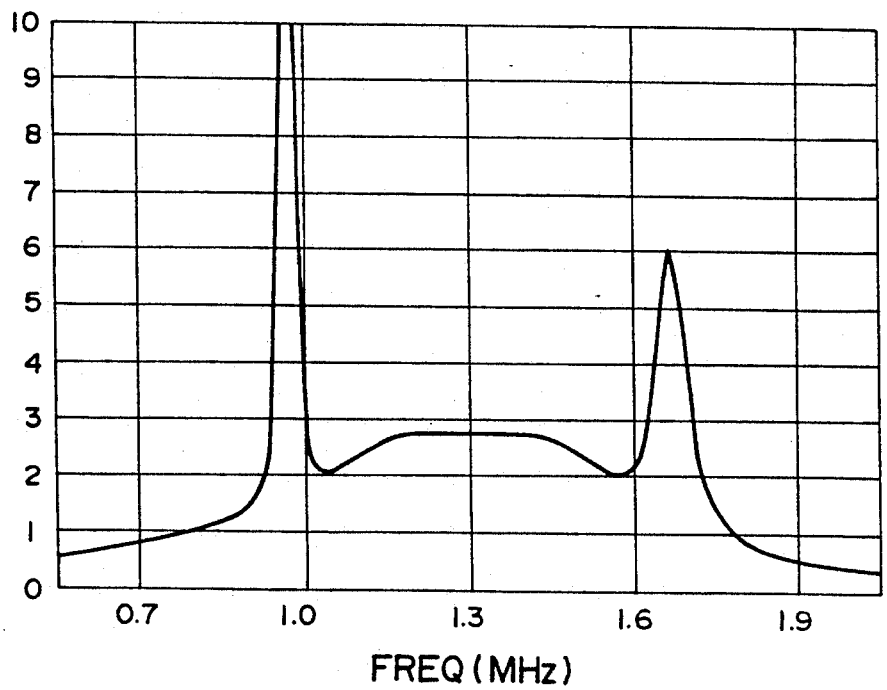
Figure 9:
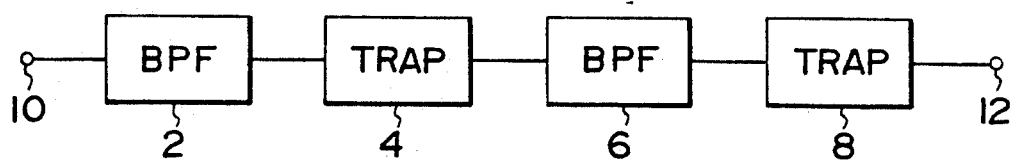
FIG. 9 is a block diagram of the structure of a first example of a conventional filter equipment.
Figure 10:
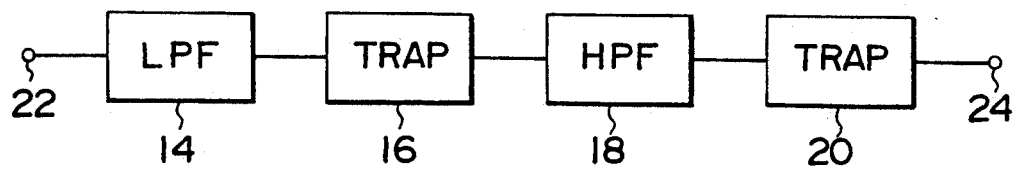
FIG. 10 is a block diagram of the structure of a second example of a conventional filter equipment.

FIGS. 7 and 8 show the gain response and the group delay response, respectively, of a linear phase filter which was produced by way of trail by the present inventor. The filter produced had a structure shown in FIG. 1 and the center frequency fr was set at 1.3 MHz. The group delay flattening effect is realized across a frequency band of 0.6 MHz with the central frequency fr as the center, as shown in FIG. 8.

As described above, according to the present invention, a linear phased filter is realized by providing a filter which makes the group delay response flat. Although the center frequency of the linear filter shown in FIGS. 7 and 8 is set at 1.3 MHz, a similar effect can be produced in another frequency band, for example, a frequency band having a center frequency at 1.7 MHz.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A filter device, comprising:
   a first filter having a predetermined pass band and a group delay characteristic having a ripple therein; and
   a second filter connected to an output of said first filter and having a pass band within the pass band of the first filter, said second filter having a gain which decreases gradually and continuously from a maximum at a predetermined frequency in the pass band of the second filter into the higher and lower frequency regions, and said second filter having a group delay which decreases gradually and continuously from a maximum at said predetermined frequency into the higher and lower frequency regions so as to reduce the ripple of the group delay of the first filter.

2. A filter device according to claim 1, wherein the first filter comprises a plurality of unit filters connected together in a cascade.

3. A filter device according to claim 1, wherein the second filter comprises a plurality of unit filters connected together in a cascade.

4. A filter device according to claim 1, wherein the first filter includes a bandpass filter for determining the pass band of the first filter.

5. A filter device according to claim 4, wherein the bandpass filter includes:
   a low-pass filter for determining the higher cutoff frequency of the pass band; and
   a high-pass filter for determining the lower cutoff frequency of the pass band.

6. A filter device according to claim 1, wherein the first filter includes a trap filter for intensifying cutoff of the first filter.

7. A filter device according to claim 1, wherein the second filter includes:
   a low-pass filter for determining the higher cutoff frequency of the pass band; and
   a high-pass filter for determining the lower cutoff frequency of the pass band.

8. A filter device according to claim 1, wherein the second filter includes a bandpass filter for determining the frequency characteristics of the second filter above and below said predetermined frequency.

* * * * *